(12) United States Patent
Isokawa et al.

(10) Patent No.: US 11,173,523 B2
(45) Date of Patent: Nov. 16, 2021

(54) SUBSTRATE PROCESSING APPARATUS

(71) Applicant: EBARA CORPORATION, Tokyo (JP)

(72) Inventors: Hidetatsu Isokawa, Tokyo (JP); Koji Maeda, Tokyo (JP); Xu Haiyang, Tokyo (JP); Shun Ehara, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/410,378

(22) Filed: May 13, 2019

(65) Prior Publication Data

US 2019/0355594 A1 Nov. 21, 2019

(30) Foreign Application Priority Data

May 18, 2018 (JP) .............................. JP2018-096411

(51) Int. Cl.
*B08B 3/02* (2006.01)
*H01L 21/67* (2006.01)
*B24B 37/34* (2012.01)
*H01L 21/687* (2006.01)
*H01L 21/677* (2006.01)
*B08B 3/04* (2006.01)

(52) U.S. Cl.
CPC ............... *B08B 3/02* (2013.01); *B08B 3/041* (2013.01); *B24B 37/345* (2013.01); *H01L 21/67051* (2013.01); *H01L 21/67219* (2013.01); *H01L 21/67745* (2013.01); *H01L 21/68707* (2013.01)

(58) Field of Classification Search
CPC ......... B08B 3/02; B08B 11/02; B24B 37/345; H01L 21/67051; H01L 21/67219; H01L 21/00–86; H01L 21/687–68792
See application file for complete search history.

(56) References Cited

U.S. PATENT DOCUMENTS

| | | | |
|---|---|---|---|
| 5,379,784 A * | 1/1995 | Nishi ...................... | B08B 11/02 134/102.3 |
| 2008/0081540 A1* | 4/2008 | Sato ...................... | B24B 37/345 451/28 |
| 2017/0285609 A1 | 10/2017 | Isokawa | |
| 2018/0001440 A1 | 1/2018 | Aono et al. | |

FOREIGN PATENT DOCUMENTS

| | | |
|---|---|---|
| JP | H11-345854 A | 12/1999 |
| JP | 2000-068244 A | 3/2000 |
| JP | 2001-300445 A | 10/2001 |
| JP | 2017-183647 A | 10/2017 |
| JP | 2018-0006549 A | 1/2018 |

* cited by examiner

*Primary Examiner* — Mikhail Kornakov
*Assistant Examiner* — Richard Z. Zhang
(74) *Attorney, Agent, or Firm* — Pearne & Gordon LLP

(57) ABSTRACT

A mechanism that conveys a substrate is cleaned in a cleaning unit. A substrate processing apparatus that includes a substrate polishing device and a substrate cleaning unit is disclosed. The substrate cleaning unit includes a cleaning module and a cleaning unit conveyance mechanism. The cleaning unit conveyance mechanism includes a hand and a hand open/close mechanism. The substrate processing apparatus further includes a hand cleaning unit. The hand cleaning unit includes a hand cleaning tank and a cleaning liquid injection mechanism.

10 Claims, 3 Drawing Sheets

SUBSTRATE PROCESSING APPARATUS

TECHNICAL FIELD

The present invention relates to a substrate processing apparatus. This application is based upon and claims benefit of priority from Japanese Patent Application No. 2018-096411 filed on May 18, 2018, the entire contents of which are incorporated herein by reference. The entire contents of Japanese Patent Application No. 2018-6549 (PTL 1) are incorporated herein by reference.

BACKGROUND ART

Conventionally, there has been known a Chemical Mechanical Polishing (CMP) apparatus for polishing a surface of a substrate. A common CMP apparatus includes a polishing table to which a polishing pad is mounted and a top ring (polishing head, in other words) to which the substrate is mounted. The polishing pad is supplied with a polishing liquid. The common CMP apparatus presses the substrate onto the polishing pad and rotates at least one of the polishing table and the top ring, preferably both, to polish the substrate.

The polishing by the CMP apparatus possibly causes a foreign material, such as an abrasive grain in the polishing liquid, to adhere to the substrate. The foreign material adhered to the substrate possibly causes a defect and the like on the substrate. Accordingly, the foreign material adhered to the substrate is preferred to be removed after polishing the substrate. PTL 1 (Japanese Unexamined Patent Application Publication No. 2018-6549) discloses a substrate processing apparatus that includes polishing devices (reference numerals 21a to 21d, "POS" of FIG. 1), cleaning modules (reference numerals 311a to 314a and 311b to 314b, "CL" or "Dry" of FIG. 1), and cleaning unit conveyance mechanisms (reference numerals 32a and 32b, "CLTP" of FIG. 2).

CITATION LIST

Patent Literature

PTL 1: Japanese Unexamined Patent Application Publication No. 2018-6549

SUMMARY OF INVENTION

Technical Problem

Examinations by the applicant has found that it is preferable to clean not only the substrate itself but also a mechanism to convey the substrate in the cleaning unit for improving cleaning performance of the substrate processing apparatus. While PTL 1 discloses the cleaning of the substrate by the cleaning module and proper use of gripping mechanisms depending on cleanliness of the substrate, the cleaning of the cleaning unit conveyance mechanism is not disclosed. Therefore, it is an object of this application to clean at least a part of a cleaning unit conveyance mechanism in a substrate processing apparatus that includes the cleaning unit conveyance mechanism.

Solution to Problem

This application discloses a substrate processing apparatus as one embodiment. The substrate processing apparatus includes a substrate polishing device and a substrate cleaning unit configured to clean a substrate polished by the substrate polishing device. The substrate cleaning unit includes a cleaning module configured to perform a cleaning of the substrate and a cleaning unit conveyance mechanism configured to convey the substrate in the substrate cleaning unit. The cleaning unit conveyance mechanism includes a hand configured to hold the substrate and a hand open/close mechanism configured to open and close the hand. The substrate processing apparatus further includes a hand cleaning unit configured to clean the hand. The hand cleaning unit includes a hand cleaning tank and a cleaning liquid injection mechanism. The hand cleaning tank is disposed on a side portion of the cleaning module in a direction in which the hand opens and closes. The hand cleaning tank is configured to house the hand. The cleaning liquid injection mechanism is configured to inject a cleaning liquid toward a predetermined position when the hand is housed in the hand cleaning tank.

DESCRIPTION OF EMBODIMENTS

Figure 1:
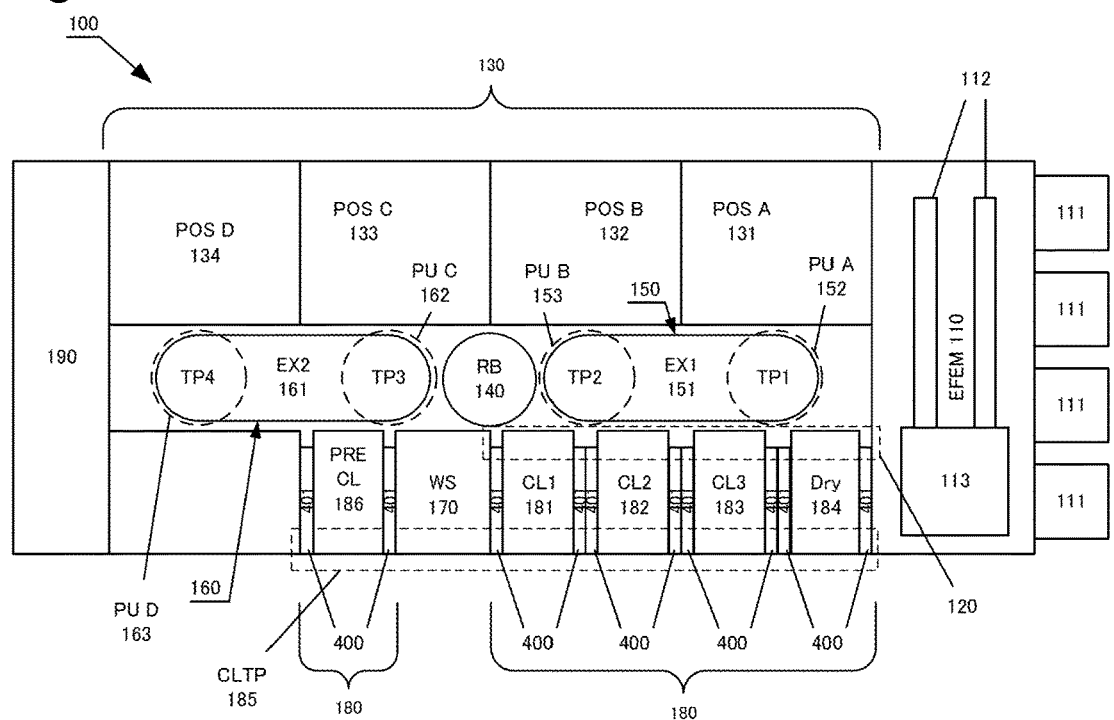
FIG. 1 is a schematic top view illustrating an overall configuration of a substrate processing apparatus.

FIG. 1 is a schematic top view illustrating an overall configuration of a substrate processing apparatus 100 according to one embodiment. Note that it is not always necessary to include all the components described below in embodying the invention disclosed in claims. The substrate processing apparatus 100 of FIG. 1 includes a loading/unloading unit 110, a conveyor 120 between the loading/unloading unit and the polishing unit, and a polishing unit 130.

The loading/unloading unit 110 (also indicated as "EFEM" in FIG. 1) is disposed to load a substrate 200 (see FIGS. 2A and 2B for the reference numeral "200") that needs to be processed from an outside of the substrate processing apparatus 100 and to unload the substrate 200 that has finished the processing from an inside of the substrate processing apparatus 100. The substrate 200 may be a silicon wafer, or may be a substrate of another type. The loading/unloading unit 110 includes at least one (four, in the illustrated example) FOUP 111, a running mechanism 112 disposed along an arranging direction of the FOUPs 111, and a conveyor 113 of the loading/unloading unit configured to move along the running mechanism 112. The FOUP 111 can house the substrate 200 or a substrate cassette where the substrate 200 is housed. The conveyor 113 of the loading/unloading unit moves to a proximity of the desired FOUP 111 along the running mechanism 112, and receives/hands over the substrate 200 from/to the desired FOUP 111.

The conveyor 120 between the loading/unloading unit and the polishing unit is disposed to convey the substrate 200 before the polishing from the loading/unloading unit 110 to the polishing unit 130. Specifically, the conveyor 120 between the loading/unloading unit and the polishing unit receives the substrate 200 held by the conveyor 113 of the loading/unloading unit. The substrate 200 conveyed by the conveyor 120 between the loading/unloading unit and the polishing unit is further conveyed to the polishing unit 130 using a central conveyance robot 140 (also indicated as "RB" in FIG. 1) described later, a first conveyance unit 150 between the polishing unit and a substrate cleaning unit, and a second conveyance unit 160 between the polishing unit and the substrate cleaning unit. The polishing unit 130 in the example of FIG. 1 includes a first polishing device 131, a second polishing device 132, a third polishing device 133, and a fourth polishing device 134. The substrate 200 is further conveyed to any of the first polishing device 131, the second polishing device 132, the third polishing device 133, and the fourth polishing device 134 (also indicated as "POSs A to D" in FIG. 1). The first polishing device 131 and the second polishing device 132 may constitute one polishing unit, and the third polishing device 133 and the fourth polishing device 134 may constitute further one polishing unit.

The first polishing device 131 to the fourth polishing device 134 are each, for example, a CMP apparatus. However, the first polishing device 131 to the fourth polishing device 134 may be each a polishing device other than the CMP apparatus. The first polishing device 131 to the fourth polishing device 134 each include a polishing table (not illustrated) to which a polishing pad is mounted and a top ring (not illustrated). However, the first polishing device 131 to the fourth polishing device 134 may be each a CMP apparatus that has a configuration other than the above-described configuration. The first polishing device 131 to the fourth polishing device 134 may each include a liquid supply device (not illustrated) for supplying a polishing liquid and the like to the polishing pad. The liquid supply device may be separately included in each of the first polishing device 131 to the fourth polishing device 134. One liquid supply device may be configured to supply the liquid to a plurality of polishing devices.

The central conveyance robot 140 of FIG. 1 is disposed in the approximately center of the substrate processing apparatus 100 viewed from above. Instead of the central conveyance robot 140, a conveyance robot not disposed in the center of the substrate processing apparatus 100 may be used. That is, the term "central" of the "central conveyance robot" is a term attached to distinguish the "central conveyance robot" from other members in this application. Accordingly, the term "central" does not limit the specific configuration of the "central conveyance robot." The central conveyance robot 140 can receive the substrate 200 from the conveyor 120 between the loading/unloading unit and the polishing unit with a substrate holding hand (not illustrated), and can selectively hand over the substrate 200 to the first conveyance unit 150 between the polishing unit and the substrate cleaning unit and the second conveyance unit 160 between the polishing unit and the substrate cleaning unit. The central conveyance robot 140 is configured to hand over the substrate 200 to also a wafer station 170 (also indicated as "WS" in FIG. 1) described later.

The first conveyance unit 150 between the polishing unit and the substrate cleaning unit of FIG. 1 includes a first exchanger 151 (also indicated as "EX1" in FIG. 1), a first pusher 152 (also indicated as "PU A" in FIG. 1), and a second pusher 153 (also indicated as "PU B" in FIG. 1). Similarly, the second conveyance unit 160 between the polishing unit and the substrate cleaning unit of FIG. 1 includes a second exchanger 161 (also indicated as "EX2" in FIG. 1), a third pusher 162 (also indicated as "PU C" in FIG. 1), and a fourth pusher 163 (also indicated as "PU D" in FIG. 1). The first exchanger 151 and the second exchanger 161 each include, for example, a plurality of stages for exchanging the substrate 200 polished by the first polishing device 131 to the fourth polishing device 134.

The first pusher 152 to the fourth pusher 163 are disposed on a first conveyance position TP1 to a fourth conveyance position TP4, respectively. The first pusher 152 to the fourth pusher 163 are each configured to move up and down. The first pusher 152 is configured to move up and down to hand over the substrate 200 held onto the stage of the first exchanger 151 to the top ring of the first polishing device 131. Furthermore, the first pusher 152 is configured to move up and down to cause the stage of the first exchanger 151 to receive the substrate 200 held onto the top ring of the first polishing device 131. Similarly, the second the pusher 153 is disposed to receive and hand over the substrate 200 between the first exchanger 151 and the top ring of the second polishing device 132. The third pusher 162 is disposed to receive and hand over the substrate 200 between the second exchanger 161 and the top ring of the third polishing device 133. The fourth pusher 163 is disposed to receive and hand over the substrate 200 between the second exchanger 161 and the top ring of the fourth polishing device 134.

The substrate 200 polished by the polishing unit 130 and received by the first exchanger 151 or the second exchanger 161 is held by the central conveyance robot 140 again. Afterwards, the substrate 200 is conveyed to the wafer station 170 by the central conveyance robot 140. The wafer station 170 is disposed to house and hold the substrate 200 after the polishing and before cleaning.

A substrate cleaning unit 180 is configured to clean the polished substrate 200. As one example, the substrate cleaning unit 180 of FIG. 1 includes at least one, preferably a plurality of cleaning modules. The cleaning module includes a cleaner (not illustrated). The cleaning module performs a cleaning of the substrate 200 with the cleaner. When a plurality of cleaning modules are included, a plurality of cleaning processes can be performed. In one embodiment, the substrate cleaning unit 180 includes a first cleaning module 181 (also indicated as "CL1" in FIG. 1), a second cleaning module 182 (also indicated as "CL2" in FIG. 1), a third cleaning module 183 (also indicated as "CL3" in FIG. 1), and a fourth cleaning module 184. The cleaning module (the fourth cleaning module 184 in the example of FIG. 1) that performs the final process of the cleaning may have a function to dry the substrate 200, for example, a function to spin the substrate 200 (spin-dry function). Therefore, the fourth cleaning module 184 is indicated as "Dry" in FIG. 1. A drying module may be additionally or alternatively disposed on a position after the fourth cleaning module 184.

The substrate cleaning unit 180 includes a cleaning unit conveyance mechanism 185 (also indicated as "CLTP" in FIG. 1) for conveying the substrate 200 in the substrate cleaning unit 180. The cleaning unit conveyance mechanism 185 conveys the substrate 200, for example, from the first cleaning module 181 to the second cleaning module 182. Similarly, the cleaning unit conveyance mechanism 185 conveys the substrate 200, for example, from the second cleaning module 182 to the third cleaning module 183, and from the third cleaning module 183 to the fourth cleaning module 184. The cleaning unit conveyance mechanism 185 may be configured to convey the substrate 200 to a preliminary cleaning module 186 described later. The cleaning unit conveyance mechanism 185 may be configured to convey the substrate 200 from the wafer station 170 to the substrate cleaning unit 180.

The substrate cleaning unit 180 may further include the preliminary cleaning module 186 (also indicated as "PRE CL" in FIG. 1). The preliminary cleaning module 186 may be configured to clean or process the substrate 200 before polishing. As one example, the preliminary cleaning module 186 may include a wet etching device that removes a natural oxide film from a surface of the substrate 200 before polishing. As another example, the preliminary cleaning module 186 may include a buff polishing device that removes coarse particles from the surface of the substrate 200 before polishing. When the substrate cleaning unit 180 includes the preliminary cleaning module 186, the cleaning unit conveyance mechanism 185 is preferably configured to convey the substrate 200 to the preliminary cleaning module 186. An additional conveyance mechanism may be disposed in addition to the cleaning unit conveyance mechanism 185 for the preliminary cleaning module 186.

The substrate processing apparatus 100 may further include a control unit 190. The control unit 190 may be configured to control at least one of the operations of various components of the substrate processing apparatus 100, for example, the loading/unloading unit 110, the conveyor 120 between the loading/unloading unit and the polishing unit, the polishing unit 130, the central conveyance robot 140, the first conveyance unit 150 between the polishing unit and the substrate cleaning unit, the second conveyance unit 160 between the polishing unit and the substrate cleaning unit, the wafer station 170, and the substrate cleaning unit 180. The control unit 190 may be configured as a part of the substrate processing apparatus 100. The control unit 190 may be disposed outside the substrate processing apparatus 100. In other words, the control unit 190 separated and independent from the substrate processing apparatus 100 may be employed.

Figure 2A:
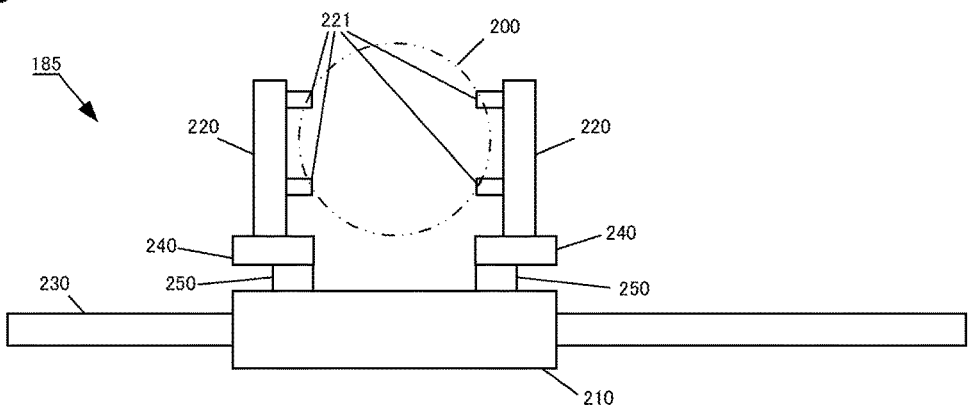
FIG. 2A is a top view schematically illustrating a cleaning unit conveyance mechanism.
Figure 2B:
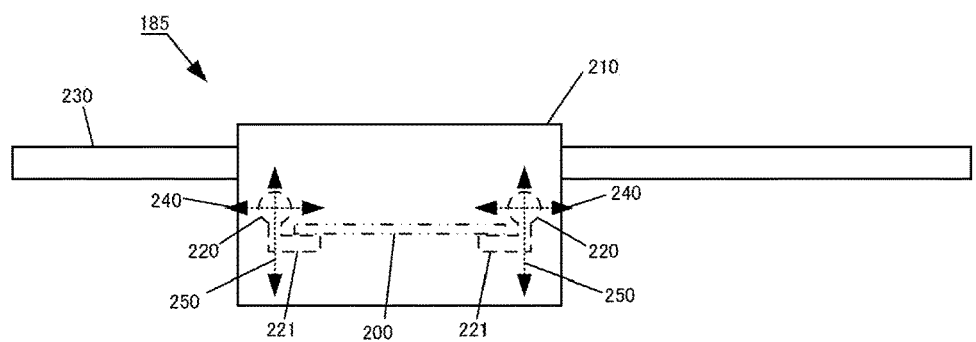
FIG. 2B is a front view schematically illustrating the cleaning unit conveyance mechanism.

The configuration of the cleaning unit conveyance mechanism 185 will be described by referring to FIGS. 2A and 2B. FIG. 2A is a top view schematically illustrating the cleaning unit conveyance mechanism 185. FIG. 2B is a front view schematically illustrating the cleaning unit conveyance mechanism 185. FIG. 2A and FIG. 2B illustrate the substrate 200 held and conveyed by the cleaning unit conveyance mechanism 185 with imaginary lines. The cleaning unit conveyance mechanism 185 of FIGS. 2A and 2B includes a main frame 210, hands 220, a main frame moving mechanism 230, hand open/close mechanisms 240, and hand up-and-down motion mechanisms 250. However, for ease of illustration, the hand open/close mechanisms 240 and the hand up-and-down motion mechanisms 250 are not illustrated in FIG. 2B. Alternatively, FIG. 2B illustrates arrows indicating ways of the hands 220 moved by the hand open/close mechanisms 240 and the hand up-and-down motion mechanisms 250. Reference numerals "240" and "250" in FIG. 2B are attached to those arrows.

The main frame moving mechanism 230 extends along the arranging direction (right-left directions in FIG. 1 and FIGS. 2A and 2B) of the cleaning modules (181 to 184). The main frame moving mechanism 230 and/or the main frame 210 may include, for example, a ball screw, a motor, and/or a linear actuator. The main frame 210 is configured to be movable along the main frame moving mechanism 230. Accordingly, the main frame 210 is movable along the arranging direction of the cleaning modules. The main frame 210 moving along the arranging direction of the cleaning modules ensures selecting the cleaning module to convey the substrate 200/take out the substrate 200.

From the main frame 210, the two hands 220 extend to hold the substrate 200. The hands 220 are rod-shaped members. In the example of FIGS. 2A and 2B, the hands 220 extend in a direction (up-down directions of FIG. 1 and FIG. 2A, near-far direction of FIG. 2B) perpendicular to a longitudinal direction of the main frame moving mechanism 230 in a horizontal surface. Specifically, the hands 220 hold the substrate 200 with claws 221. In the example of FIGS. 2A and 2B, the one hand 220 includes the two claws 221. Accordingly, in the example of FIGS. 2A and 2B, the substrate 200 is held by the four claws 221 in total. The claws 221 are preferably configured such that contacted areas of the substrate 200 and the claws 221 are small as much as possible and the substrate 200 is stably held.

The hand open/close mechanism 240 is a mechanism to open and close the hand 220. In the example of FIGS. 2A and 2B, two hands 220 each include the hand open/close mechanism 240. The hand open/close mechanisms 240 of FIGS. 2A and 2B move the respective hands 220 in a direction identical to the longitudinal direction of the main frame moving mechanism 230. Accordingly, the hand open/close mechanisms 240 increase and decrease a distance between the two hands 220. When the distance between the two hands 220 is decreased to a predetermined distance or less (for example, the distance equal to or less than a diameter of the substrate 200), that is, when the hands 220 are "close," the claws 221 can hold the substrate 200. When the distance between the two hands 220 is increased to a distance longer than the predetermined distance (for example, the distance longer than the diameter of the substrate 200), that is, when the hands 220 are "open," the hold of the substrate 200 by the claws 221 is released.

The hand up-and-down motion mechanism 250 is a mechanism to move the hand 220 up and down. In the example of FIGS. 2A and 2B, the two hand up-and-down motion mechanisms 250 are disposed to move the respective two hands 220. Alternatively, the one hand up-and-down motion mechanism 250 may move a plurality of hands 220 up and down. The cleaning unit conveyance mechanism 185 operates the hands 220 with the hand open/close mechanisms 240 and the hand up-and-down motion mechanisms 250 to receive the substrate 200 from the wafer station 170 and the like and hand over the substrate 200 to the first cleaning module 181 and the like.

Note that FIGS. 2A and 2B merely illustrate the exemplary and schematic configuration of the cleaning unit conveyance mechanism 185. For example, the hand open/close mechanisms 240 and the hand up-and-down motion mechanisms 250 of FIGS. 2A and 2B are configured to move the hands 220 in parallel. Additionally or alternatively, a mechanism that pivotally moves or rotates the hand 220 to perform the open and close or the up-and-down motion of the hand 220 may be employed. The positions, the shapes, the numbers, and the like of the hand 220 and the claw 221 may be appropriately set. The hand open/close mechanisms 240 and the hand up-and-down motion mechanisms 250 may operate the respective hands 220 independently. Meanwhile, the hand open/close mechanisms 240 and the hand up-and-down motion mechanisms 250 may be configured to operate the respective hands 220 in synchronization. The one hand up-and-down motion mechanism 250 may be mounted to the main frame 210, or the one hand up-and-down motion mechanism 250 may be configured to simultaneously move the two hands 220.

Figure 3:
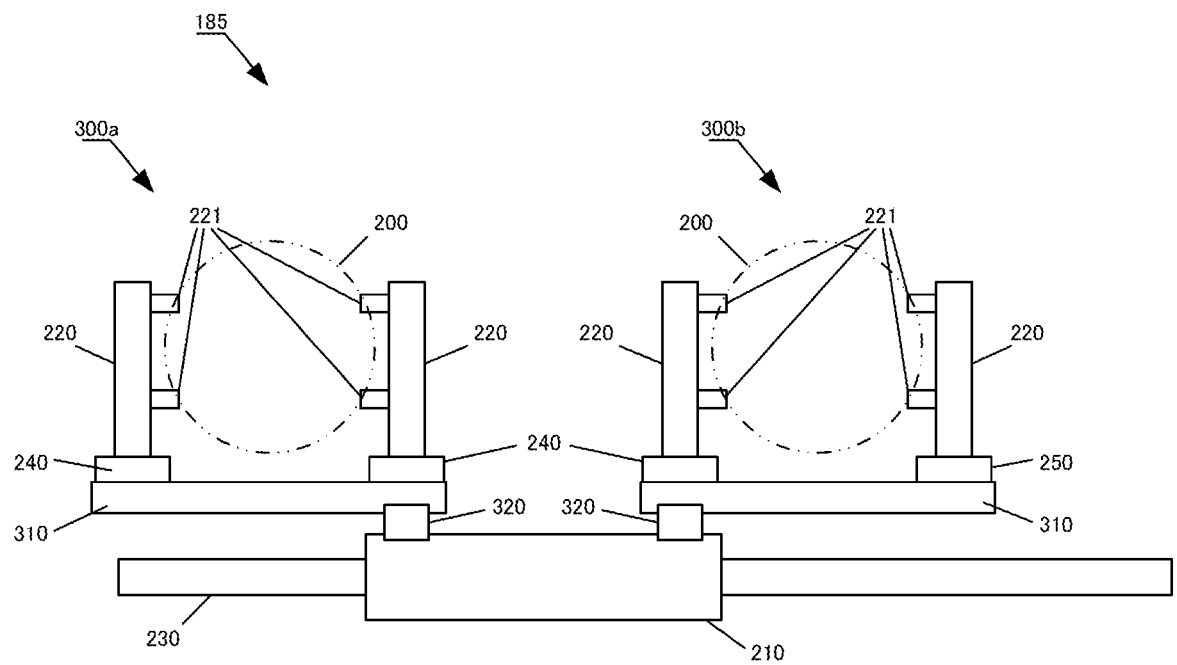
FIG. 3 is a top view schematically illustrating the cleaning unit conveyance mechanism that includes a plurality of substrate holders.

The cleaning unit conveyance mechanism 185 that includes a plurality of substrate holders also can be used. FIG. 3 is a top view schematically illustrating the cleaning unit conveyance mechanism 185 that includes two substrate holders (a first substrate holder 300a and a second substrate holder 300b). The first substrate holder 300a and the second substrate holder 300b each include a sub-frame 310, the hand open/close mechanisms 240 mounted to the sub-frame 310, and the hands 220. The sub-frames 310 are mounted to the main frame 210 via sub-frame up-and-down motion mechanisms 320. The sub-frame up-and-down motion mechanism 320 is a mechanism to move the sub-frame 310 up and down. Since the up-and-down motion of the sub-frame 310 moves the hand 220 up and down, the cleaning unit conveyance mechanism 185 of FIG. 3 does not include the hand up-and-down motion mechanism 250 as illustrated in FIGS. 2A and 2B. Since the sub-frame 310 finally moves the hand 220 up and down, the sub-frame up-and-down motion mechanism 320 can be also referred to as one kind of the hand up-and-down motion mechanism 250. The cleaning unit conveyance mechanism 185 including a plurality of substrate holders ensures, for example, the simultaneous conveyance of the substrates 200 and proper use of the substrate holders depending on cleanliness. For example, the first substrate holder 300a can be used in the cases of (1) the conveyance of the substrate 200 from the wafer station 170 to the first cleaning module 181 and (2) the conveyance of the substrate 200 from the first cleaning module 181 to the second cleaning module 182, and the second substrate holder 300b can be used in the cases of (3) the conveyance of the substrate 200 from the second cleaning module 182 to the third cleaning module 183 and (4) the conveyance of the substrate 200 from the third cleaning module 183 to the fourth cleaning module 184.

The above-described configuration of the substrate processing apparatus 100 is one example. The specific sizes, numbers, positions, functions, operations, and the like of the components of the substrate processing apparatus 100 may be determined with reference to the disclosure of, for example, PTL 1 (Japanese Unexamined Patent Application Publication No. 2018-6549).

It has been considered that the hands 220 or the claws 221 are less likely to cause a defect of the substrate 200 because the contacted areas of the claws 221 and the substrate 200 are small. However, it has been proved that the defect caused by the hand 220 or the claw 221 is no longer able to be ignored as, for example, a semiconductor process becomes miniaturized or multi-layered. Especially, the substrate cleaning unit 180 needs to have the considerably high cleanliness compared with the polishing unit 130 because the substrate cleaning unit 180 is a unit to clean the substrate. As a process where the hand 220 or the claw 221 causes the defect on the substrate 200, the following process is thought. Note that the following process is merely an example.

A foreign material, such as an abrasive grain or polishing waste remaining on the surface of the substrate 200 or in a cleaning liquid, accumulates on the hand 220 or the claw 221 in the conveyance of the substrate 200 or similar case. Abrasion powders generated at a contact portion of the claw 221 and the substrate 200 or a movable part of the cleaning unit conveyance mechanism 185 possibly accumulate on the hand 220 or the claw 221 (hereinafter, the abrasive grain, the polishing waste, the abrasion powder, and the like are collectively referred to as the "foreign material"). The foreign material accumulated on the hand 220 or the claw 221 accumulates on the substrate 200 or is diffused in the cleaning liquid when the substrate 200 is conveyed again, the other substrate 200 is conveyed, or similar case. The foreign material accumulated on the substrate 200 or diffused in the cleaning liquid causes the defect on the substrate 200.

To prevent the defect of the substrate 200 caused in the above-described process, it is considered to be necessary to keep the hand 220 and/or the claw 221 clean. Therefore, the substrate processing apparatus 100 according to the one embodiment includes a hand cleaning unit 400 (see FIG. 1 and FIG. 4) to clean not only the substrate 200 but also the hand 220 and/or the claw 221. Since the claw 221 is a part of the hand 220, "the hand 220 and/or the claw 221" is simply referred to as "the hand 220" hereinafter in some cases. The hand cleaning unit 400 includes a pair of hand cleaning tanks 401 (see FIG. 4 described below) having rectangular shapes in plan view from above. The rectangular-shaped hand cleaning tank 401 has a longitudinal direction approximately identical to the direction in which the hand 220 extends (up-down direction of FIG. 1). This is because the hand 220 is housed in the hand cleaning tank 401. As the configuration of the hand cleaning unit 400, another configuration may be employed. For example, instead of the pair of rectangular-shaped hand cleaning tanks 401, the single hand cleaning tank 401 having a U shape in plan view from above may be disposed.

The hand cleaning unit 400 is disposed on a side portion of at least one cleaning module. More specifically, the hand cleaning unit 400 is disposed on the side portion (side portion in the right-left direction of FIG. 1) of the cleaning module in the direction in which the hand 220 opens and closes. Further specifically, the hand cleaning unit 400 is disposed on both side portions of the cleaning module. Furthermore, the hand cleaning unit 400 is disposed on a position where the hand 220 can be housed when the hand 220 is opened and moved down by the hand open/close mechanism 240 and the hand up-and-down motion mechanism 250. In FIG. 1, the hand cleaning unit 400 is disposed on the side portion of every cleaning module, that is, each side portion of the first cleaning module 181 to the fourth cleaning module 184 and the preliminary cleaning module 186. The hand cleaning unit 400 may be disposed on the side portion of the wafer station 170. As seen from FIG. 1, when the hand cleaning units 400 including the pair of hand cleaning tanks 401 are disposed on the side portions of all the cleaning modules, one hand cleaning tank 401 is adjacent to another hand cleaning tank 401 in some cases. The single hand cleaning tank 401 replaced with the two adjacent hand cleaning tanks 401 can reduce the number of the hand cleaning tanks 401.

With the hand cleaning unit 400 disposed on the side portion of the cleaning module, the substrate processing apparatus 100 according to the one embodiment can clean the hand 220 before the foreign material accumulated on the hand 220 becomes fixed. The following describes the hand cleaning unit 400 in detail with reference to FIG. 4.

Figure 4:
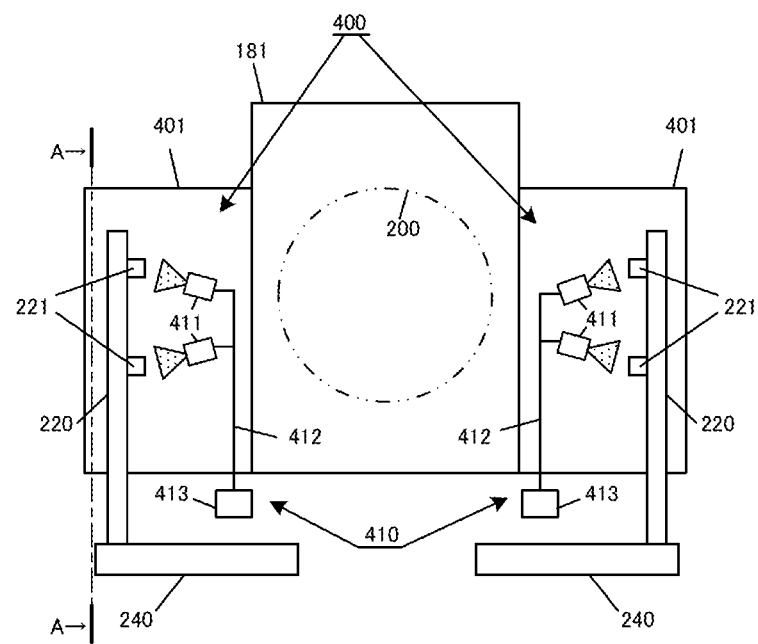
FIG. 4 is a top view schematically illustrating a first cleaning module and a hand cleaning unit disposed on a side portion of the first cleaning module.

FIG. 4 is a top view schematically illustrating the first cleaning module 181 and the hand cleaning unit 400 disposed on the side portion of the first cleaning module 181. The description regarding FIG. 4 applies to the cleaning modules other than the first cleaning module 181 and the hand cleaning units 400 disposed on the side portions of those cleaning modules. Note that, for ease of illustration, the shapes of the respective components illustrated in FIG. 4 are possibly different from the shapes of the respective components illustrated in other drawings. FIG. 4 also illustrates the hand open/close mechanisms 240 and the hands 220 to be cleaned by the hand cleaning unit 400.

The hand cleaning unit 400 includes a pair of hand cleaning tanks 401 configured to house the respective hands 220 and a cleaning liquid injection mechanism 410 that injects the cleaning liquid toward a predetermined position when the hand 220 is housed in the cleaning tank 401. When the hand 220 includes the claw 221, the claw 221 is also housed in the hand cleaning tank 401 when the hand 220 is housed in the hand cleaning tank 401. The predetermined position may include a position where the hand 220 is to be housed. The predetermined position may include a position where the claw 221 of the hand 220 is to be housed. The respective hand cleaning tanks 401 are disposed at positions on the side portion of the first cleaning module 181 and the positions where the respective hands 220 can be housed when the hands 220 are opened by the hand open/close mechanisms 240 and the hands 220 are moved down by the hand up-and-down motion mechanisms 250. Note that, as described above, the sub-frame up-and-down motion mechanism 320 is one kind of the hand up-and-down motion mechanism 250, that is, the hand 220 may be moved up and down by the sub-frame up-and-down motion mechanism 320.

The cleaning liquid injection mechanism 410 includes nozzles 411, a flow passage 412 connected to the nozzles 411, and a cleaning liquid source 413 connected to the flow passage 412. Note that the flow passage 412 and the cleaning liquid source 413 may be the members separate and independent from the cleaning liquid injection mechanism 410, that is, the members separate and independent from the substrate processing apparatus 100. The cleaning liquid is injected from the nozzles 411 of FIG. 4 toward at least a part of the hand 220. That is, the cleaning liquid injection mechanism 410 may be configured to inject the cleaning liquid toward the position where the hand 220 is to be housed when the hand 220 is housed in the cleaning liquid injection mechanism 410. In FIG. 4, the cleaning liquid injected from the nozzles 411 is illustrated in a triangle shape hatched with dots. However, the nozzle 411 does not need to inject the cleaning liquid in the triangle shape. Specifically, the nozzle 411 may be configured to inject the cleaning liquid to at least a part of the claw 221. That is, the cleaning liquid injection mechanism 410 may be configured to inject the cleaning liquid toward the position where the claw 221 is to be housed when the hand 220 is housed in the hand cleaning tank 401. More specifically, the nozzle 411 may be configured to inject the cleaning liquid to a part to contact the substrate 200 of the claw 221. The number of the nozzles 411 disposed on the one hand cleaning tank 401 is preferred to correspond to the number of the claws 221 disposed on the one hand 220. For example, in the example of FIG. 4, the one hand cleaning tank 401 includes the two nozzles 411. However, the number of the nozzles 411 does not need to correspond to the number of the claws 221. The nozzle 411 configured to inject the cleaning liquid in a wide range, the movable nozzle 411, the nozzle 411 configured to change an injecting direction of the cleaning liquid, or the like may be employed. The injection of the cleaning liquid toward the hand 220 cleans the hand 220.

It is considered that when the dirty cleaning liquid after the cleaning of the hand 220 flows into the cleaner of the first cleaning module 181, the cleaning performance of the cleaner is influenced. In this embodiment, the cleaning of the hand 220 is performed inside the hand cleaning tank 401. Accordingly, the cleaning liquid used in the hand cleaning unit 400 is less likely to flow into the cleaner of the first cleaning module 181. Furthermore, to prevent the injected cleaning liquid from flowing toward the substrate 200, the nozzle 411 is preferably configured to inject the cleaning liquid in a direction moving away from a position where the substrate 200 will be cleaned. Alternatively or additionally, the substrate processing apparatus 100 may include a mechanism to prevent the injected cleaning liquid from flowing into the cleaner of the cleaning module, for example, a shutter, a filter, or an airflow generator.

Figure 5:
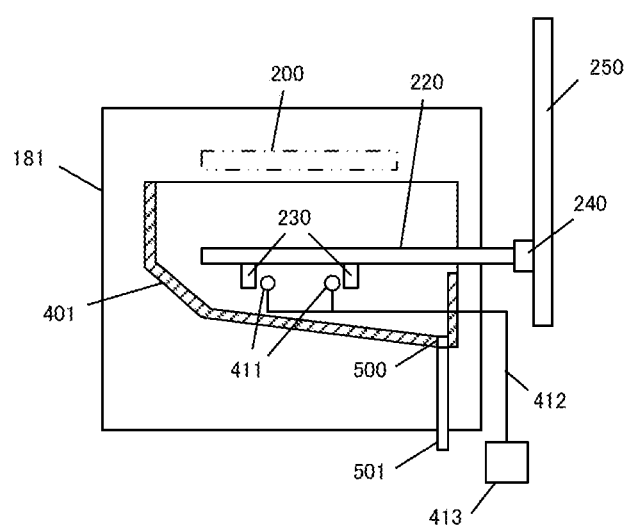
FIG. 5 is a cross-sectional side view taken along a line A-A in FIG. 4.

FIG. 5 is a cross-sectional side view taken along a line A-A in FIG. 4. FIG. 5 illustrates the hand up-and-down motion mechanism 250 in addition to the members illustrated in FIG. 4. Note that the sub-frame up-and-down motion mechanism 320 is one kind of the hand up-and-down motion mechanism 250, that is, the reference numeral "250" of FIG. 5 may be the reference numeral "320." The hand cleaning tank 401 has an open top surface such that the hand 220 moved down by the hand up-and-down motion mechanism 250 can be received. For allowing the reception of the hand 220, among the side surfaces of the hand cleaning tank 401, an upper part of the side surface (a surface on the right side in FIG. 5) closest to a base of the hand 220 is opened. Meanwhile, for preventing the cleaning liquid from flowing out of the hand cleaning tank 401, a lower part of the side surface closest to the base of the hand 220 among the side surfaces of the hand cleaning tank 401 is closed. However, the configuration of the hand cleaning tank 401 is not limited to the configuration illustrated in FIG. 5. For example, when the hand 220 has a distal end side configured to be lower than the base side of the hand 220 or to be inclined, the upper part of the surface closest to the cleaning unit conveyance mechanism 185 among the side surfaces of the hand cleaning tank 401 may be closed. For example, when the cleaning liquid is allowed to flow out of the hand cleaning tank 401, the lower part of the surface closest to the cleaning unit conveyance mechanism 185 among the side surfaces of the hand cleaning tank 401 may be opened. The hand cleaning tank 401 is configured not to inhibit the operation of the substrate cleaning unit 180, especially the operation of the cleaning unit conveyance mechanism 185. For example, the hand cleaning tank 401 has a height (position of an upper end of the hand cleaning tank 401) configured such that the hand cleaning tank 401 does not collide against the other members (the substrate 200, the hand 220, or the like) while the cleaning unit conveyance mechanism 185 conveys the substrate 200.

Usually, the used cleaning liquid is collected. Therefore, the hand cleaning tank 401 may have a bottom portion where an opening 500 is formed. The opening 500 may be connected to, for example, a drain line 501. The bottom portion of the hand cleaning tank 401 is preferably configured to be lowered toward the opening 500. In other words, the opening 500 is preferably disposed to the position lowest of the hand cleaning tank 401. The bottom portion of the hand cleaning tank 401 configured to be lowered toward the opening 500 causes the cleaning liquid injected from the nozzle 411 to flow toward the opening 500 due to gravity. The collected cleaning liquid may be returned to the cleaning liquid source 413, may be used for other than the cleaning of the hand 220, or may be disposed.

The cleaning (injection of the cleaning liquid toward the predetermined position) of the hand 220 by the hand cleaning unit 400 may be performed any of after the substrate 200 is conveyed to the cleaning module, before the substrate 200 is conveyed from the cleaning module, or in a standby time of the substrate cleaning unit 180. (The standby time means a period where the cleaning process of the substrate 200 by the substrate cleaning unit 180 is not performed. The standby time includes a period where, for example, the substrate 200 does not exist anywhere of the substrate cleaning unit 180. The operation performed in this period is referred to as "dummy dispense" in some cases. Note that it is not always necessary to convey a dummy substrate (aluminum board or the like).) The cleaning of the hand 220 after the substrate 200 is conveyed to the cleaning module ensures the cleaning of the hand 220 before the foreign material is fixed to the hand 220. The cleaning of the hand 220 before the substrate 200 is conveyed from the cleaning module ensures the conveyance of the substrate 200 with the hand 220 immediately after the cleaning, that is, the hand 220 considered to have the highest cleanliness. The cleaning of the hand 220 in the standby time of the substrate cleaning unit 180 ensures the cleaning of the hand 220 without increasing a time necessary for the substrate cleaning process in the substrate cleaning unit 180.

The following describes an exemplary operation of the substrate processing apparatus 100. The substrate processing apparatus 100 conveys the substrate 200 to any of the cleaning modules with the main frame moving mechanism 230 and the like, thus starting the cleaning of the substrate 200. In other words, this may be referred to as that "the substrate 200 is installed to any of the cleaning modules." Next, the substrate processing apparatus 100 houses the hand 220 in the hand cleaning tank 401 with the hand open/close mechanism 240 and the like. Accordingly, the hand 220 waits in the state of being housed in the hand cleaning tank 401 during the cleaning of the substrate 200 by the cleaning module. Next, when a predetermined condition is satisfied, the substrate processing apparatus 100 takes out the hand 220 from the hand cleaning tank 401 with the hand open/close mechanism 240 and the like. "When the predetermined condition is satisfied" here includes, for example, a case where the cleaning of the substrate 200 terminates, a case where a predetermined time has passed after housing the hand 220 in the hand cleaning tank 401, and a case where the substrate 200 that is different from the substrate 200 during the cleaning needs to be conveyed. After the hand 220 is taken out from the hand cleaning tank 401, the substrate processing apparatus 100 further conveys the substrate 200 with the main frame moving mechanism 230 and the like. The substrate 200 conveyed in the "further conveyance" may be the cleaned substrate 200, or may be the substrate 200 different from the cleaned substrate 200. Note that the above-described operation is merely an example. The operation of the substrate processing apparatus 100 is changeable depending on various conditions including the number of the cleaning modules, the number of the substrates 200 during the cleaning or to be cleaned, the number of the hands 220 (the number of the substrate holders (for example, the reference numeral 300a)), the specific cleaning process of the hand 220, and the specific cleaning process of the substrate 200. In the description of the exemplary operation, the subject is "the substrate processing apparatus 100," but the substrate processing apparatus 100 may be replaced with "the control unit 190" or "the operator."

The cleaning of the hand 220 may be controlled by the control unit 190. The control unit 190 may control the hand cleaning unit 400 and the like such that the hand 220 is always cleaned every time when the substrate 200 is cleaned. The control unit 190 may control the hand cleaning unit 400 and the like such that the hand 220 is cleaned when the predetermined condition is satisfied (for example, in the case where a certain period of time has passed after the previous cleaning, in the case where the predetermined number of substrates have been conveyed, or in the case where the cleanliness of the hand 220 has fallen below a threshold value). When the substrate processing apparatus 100 includes the first substrate holder 300a and the second substrate holder 300b, the substrate processing apparatus 100 may be configured to clean the hand 220 of the first substrate holder 300a with the hand cleaning unit 400 disposed on the side portion of the first cleaning module 181. The substrate processing apparatus 100 may be configured to clean the hand 220 of the second substrate holder 300b with the hand cleaning unit 400 disposed on the side portion of the third cleaning module 183.

When the substrate processing apparatus 100, especially the substrate cleaning unit 180 includes an inspection hole (not illustrated), an operator may monitor the cleaning of the hand 220 through this inspection hole by visual check. When the substrate processing apparatus 100, especially the substrate cleaning unit 180 includes an imaging mechanism (not illustrated) such as a camera, the operator may monitor the cleaning of the hand 220 by checking an image or a video of the hand 220 taken by this imaging mechanism. When this imaging mechanism is connected to the control unit 190, the control unit 190 can monitor the cleaning of the hand 220 via this imaging mechanism. In the monitoring by the control unit 190, any image processing method (including a video processing method) may be employed. A result of the monitoring may be used for various purposes. For example, when the hand 220 is determined to be fully cleaned as the result of the monitoring, the cleaning of the hand 220 may be terminated. For example, when the cleaning efficiency of the hand 220 is determined to be decreased as the result of the monitoring, the cleaning condition of the hand 220 (for example, the type of the cleaning liquid, the temperature, the strength of the injection, or the position to clean the hand 220) may be changed.

The operator of the control unit 190 or the substrate processing apparatus 100 may clean the hand 220 in steps of: housing the hand 220 in the hand cleaning tank 401; and injecting the cleaning liquid toward the predetermined position using the cleaning liquid injection mechanism 410. In the step of injecting the cleaning liquid, the cleaning liquid may be injected toward at least a part of the hand 220 housed in the hand cleaning tank 401 using the cleaning liquid injection mechanism 410. In the step of housing the hand 220 in the hand cleaning tank 401, the hand open/close mechanism 240 and the hand up-and-down motion mechanism 250 may be used.

The control unit 190 may control the hand cleaning unit 400 and the like in accordance with the cleaning condition input through an input unit (not illustrated) and stored in a storage unit (not illustrated). For example, at least one of the following cleaning conditions may be input and stored: the cleaning time, the number of times of the cleaning, the injection speed of the cleaning liquid, the cleaning timing, the cleaning position (which hand 220 is cleaned with which hand cleaning unit 400), and the temperature of the cleaning liquid. The cleaning time of the hand 220 may be determined so as to correspond to a time where the hand 220 is housed in the hand cleaning tank 401 to be waited. That is, the cleaning time of the hand 220 may approximately correspond to the cleaning time of the substrate 200. Meanwhile, the cleaning time of the hand 220 may be configured to be shorter than the time where the hand 220 is housed in the hand cleaning tank 401 to be waited. To perform the control by the control unit 190, the control unit 190 may include a programmable logic controller (PLC), and the flow passage 412 may include a valve, a flowmeter, and the like. A measurement value by the flowmeter and the like may be fed back to the control unit 190. The valve may be opened and closed by, for example, an air pressure or a motor. When the valve is opened and closed by the air pressure, a block manifold may be disposed. When the hand cleaning unit 400 includes the valve, the control unit 190 may control the valve so as to repeatedly open and close the flow passage 412, thus intermittently injecting the cleaning liquid.

Several embodiments of the present invention have been described above in order to facilitate understanding of the present invention without limiting the present invention. The present invention can be changed or improved without departing from the gist thereof, and of course, the equivalents of the present invention are included in the present invention. It is possible to arbitrarily combine or omit respective constituent elements described in the claims and specification in a range in which at least a part of the above-described problems can be solved, or a range in which at least a part of the effects can be exhibited.

This application discloses a substrate processing apparatus as one embodiment. The substrate processing apparatus includes a substrate polishing device and a substrate cleaning unit configured to clean a substrate polished by the substrate polishing device. The substrate cleaning unit includes a cleaning module configured to perform a cleaning of the substrate and a cleaning unit conveyance mechanism configured to convey the substrate in the substrate cleaning unit. The cleaning unit conveyance mechanism includes a hand configured to hold the substrate and a hand open/close mechanism configured to open and close the hand. The substrate processing apparatus further includes a hand cleaning unit configured to clean the hand. The hand cleaning unit includes a hand cleaning tank disposed on a side portion of the cleaning module in a direction in which the hand opens and closes and configured to house the hand, and a cleaning liquid injection mechanism configured to inject a cleaning liquid toward a predetermined position when the hand is housed in the hand cleaning tank.

This description discloses a new and advanced substrate processing apparatus.

Further, this application discloses the substrate processing apparatus as one embodiment. The predetermined position includes a position where the hand is to be housed.

This description defines a target to which the cleaning liquid is injected.

Further, this application discloses the substrate processing apparatus as one embodiment. The cleaning unit conveyance mechanism further includes a hand up-and-down motion mechanism configured to move the hand up and down. The hand cleaning tank is disposed at a position where the hand is allowed to be housed when the hand is opened and moved down by the hand open/close mechanism and the hand up-and-down motion mechanism.

This disclosure defines a specific configuration of the hand cleaning tank.

Further, this application discloses the substrate processing apparatus as one embodiment. The hand is configured to hold the substrate with a claw. The predetermined position includes a position where the claw is to be housed.

This substrate processing apparatus provides an effect that ensures cleaning the claw as a part of the hand actually contacting the substrate, as one example.

Further, this application discloses the substrate processing apparatus as one embodiment. The hand cleaning tank has a bottom portion where an opening is formed. The bottom portion of the hand cleaning tank has a shape lowered toward the opening.

This substrate processing apparatus provides an effect that ensures easily collecting the used cleaning liquid, as one example.

Further, this application discloses the substrate processing apparatus as one embodiment. The hand cleaning tank has an open upper portion.

This disclosure defines a specific configuration of the hand cleaning tank.

Further, this application discloses the substrate processing apparatus as one embodiment. The substrate processing apparatus further includes a control unit. The control unit controls the substrate processing apparatus such that the cleaning liquid is injected toward the predetermined position in at least any case of:

after the substrate is conveyed to the cleaning module;
before the substrate is conveyed from the cleaning module; and
in a standby time of the substrate cleaning unit.

This disclosure defines a preferable timing for cleaning the hand.

Further, this application discloses a method for cleaning the hand in the substrate processing apparatus as one embodiment. The method for cleaning the hand includes a step of housing the hand in the hand cleaning tank and a step of injecting the cleaning liquid toward the predetermined position using the cleaning liquid injection mechanism.

This disclosure describes the method for cleaning the hand in detail.

REFERENCE SIGNS LIST

100 . . . substrate processing apparatus
110 . . . loading/unloading unit
112 . . . running mechanism
113 . . . conveyor of loading/unloading unit
120 . . . conveyor between loading/unloading unit and polishing unit
130 . . . polishing unit
131 . . . first polishing device
132 . . . second polishing device
133 . . . third polishing device
134 . . . fourth polishing device
140 . . . central conveyance robot
150 . . . first conveyance unit between polishing unit and substrate cleaning unit
151 . . . first exchanger
152 . . . first pusher
153 . . . second pusher
160 . . . second conveyance unit between polishing unit and substrate cleaning unit
161 . . . second exchanger
162 . . . third pusher
163 . . . fourth pusher
170 . . . wafer station
180 . . . substrate cleaning unit
181 . . . first cleaning module
182 . . . second cleaning module
183 . . . third cleaning module
184 . . . fourth cleaning module
185 . . . cleaning unit conveyance mechanism
186 . . . preliminary cleaning module
190 . . . control unit
200 . . . substrate
210 . . . main frame
220 . . . hand
221 . . . claw
230 . . . main frame moving mechanism 240 . . . hand open/close mechanism
250 . . . hand up-and-down motion mechanism
300a . . . first substrate holder
300b . . . second substrate holder
310 . . . sub-frame
320 . . . sub-frame up-and-down motion mechanism
400 . . . hand cleaning unit
401 . . . hand cleaning tank
410 . . . cleaning liquid injection mechanism
411 . . . nozzle
412 . . . passage
413 . . . cleaning liquid source
500 . . . opening
501 . . . drain line

What is claimed is:

1. A substrate processing apparatus comprising:
a substrate polishing device; and
a substrate cleaning unit configured to clean a substrate polished by the substrate polishing device, wherein
the substrate cleaning unit includes:
a cleaning module configured to perform a cleaning of the substrate; and
a cleaning unit conveyance mechanism configured to convey the substrate in the substrate cleaning unit,
the cleaning unit conveyance mechanism includes:
a first hand and a second hand configured to collectively hold the substrate;
a first hand open/close mechanism and a second hand open/close mechanism configured to open and close the first hand and the second hand, respectively,
the substrate processing apparatus further includes a hand cleaning unit configured to clean the first hand and the second hand, and
a first hand up-and-down motion mechanism and a second hand up-and-down motion mechanism that respectively move the first hand and the second hand up and down,
the hand cleaning unit includes:
a first hand cleaning tank and a second hand cleaning tank disposed on opposite sides, respectively, of the cleaning module in a direction in which the first hand and the second hand open and close, the first hand cleaning tank and the second hand cleaning tank being configured to house the first hand and the second hand respectively, and simultaneously when the first hand and the second hand are opened and moved down; and
a first cleaning liquid injection nozzle and a second cleaning liquid injection nozzle configured to inject a cleaning liquid toward a first predetermined position and a second predetermined position, respectively, when the first hand and the second hand are housed in the first hand cleaning tank and the second hand cleaning tank, respectively.

2. The substrate processing apparatus according to claim 1, wherein the first predetermined position and the second predetermined position include respective positions where the first hand and the second hand are to be housed.

3. The substrate processing apparatus according to claim 1, wherein
the first hand and the second hand are configured to hold the substrate with respective claws, and
the first predetermined position and the second predetermined position include respective positions where the claws are to be housed.

4. The substrate processing apparatus according to claim 1, wherein
each of the first hand cleaning tank and the second hand cleaning tank has a bottom portion where an opening is formed, and
the bottom portion of each of the first hand cleaning tank and the second hand cleaning tank has a shape lowered toward the opening.

5. The substrate processing apparatus according to claim 1, wherein each of the first hand cleaning tank and the second hand cleaning tank has an open upper portion.

6. The substrate processing apparatus according to claim 1, wherein
the substrate processing apparatus further includes a controller, and
the controller controls the substrate processing apparatus such that the cleaning liquid is injected toward the first and second predetermined positions the first predetermined position and the second predetermined position in at least any case of:
after the substrate is conveyed to the cleaning module;
before the substrate is conveyed from the cleaning module; and
in a standby time of the substrate cleaning unit.

7. A method for cleaning the first hand and the second hand in the substrate processing apparatus according to claim 1, the hand cleaning method comprising:
housing the first hand and the second hand in the first hand cleaning tank and the second hand cleaning tank, respectively; and
injecting the cleaning liquid toward the first predetermined position and the second predetermined position using the first cleaning liquid injection nozzle and the second cleaning liquid injection nozzle, respectively.

8. The substrate processing apparatus according to claim 1, wherein the cleaning unit conveyance mechanism further includes a main frame from which the first hand and the second hand extend.

9. The substrate processing apparatus according to claim 8, wherein each of the first hand and the second hand is rod-shaped and includes a claw extending outwards therefrom, and wherein each claw is configured to contact the substrate.

10. The substrate processing apparatus according to claim 1, wherein the first hand cleaning tank and the second hand cleaning tank are disposed directly adjacent the cleaning module.

* * * * *